United States Patent [19]

Gambacurta, Jr. et al.

[11] Patent Number: 4,939,782
[45] Date of Patent: Jul. 3, 1990

[54] SELF-COMPENSATING EQUALIZER

[75] Inventors: Anthony A. Gambacurta, Jr., Rochester; Mitchell J. Milton; Richard A. Neatrour, both of Webster, all of N.Y.

[73] Assignee: Applied Research & Technology, Inc., Rochester, N.Y.

[21] Appl. No.: 65,966

[22] Filed: Jun. 24, 1987

[51] Int. Cl.$^5$ ............................................. H03G 5/00
[52] U.S. Cl. ..................................... 381/103; 333/28 T
[58] Field of Search ............ 333/28 R, 28 T; 381/59, 381/98, 101, 103

[56] References Cited

U.S. PATENT DOCUMENTS

| | | | |
|---|---|---|---|
| 4,166,197 | 8/1979 | Moog et al. | 381/101 |
| 4,422,048 | 12/1983 | Edwards | 333/28 T |
| 4,559,569 | 12/1985 | Otsuki et al. | 333/28 R |
| 4,612,665 | 9/1986 | Inami et al. | 333/28 R |
| 4,694,498 | 9/1987 | Suzuki et al. | 381/59 |

*Primary Examiner*—Forester W. Isen
*Attorney, Agent, or Firm*—Cumpston & Shaw

[57] ABSTRACT

A multi-band graphic equalizer is provided that includes a plurality of controllable frequency response determining elements, each element having a primary effect in its primary frequency band and a secondary effect in at least one adjacent frequency band, a graphic input device for entering an input that graphically represents a desired frequency response characteristic, and a controller connected between the input means and the frequency response determining elements for calculating the necessary frequency response characteristic for each controllable frequency response element based on the in band and out of band effects of each element to produce the desired overall frequency response characteristic and for generating a plurality of sets of control signals, one set of control signals for each frequency response determining element, so that the overall frequency response characteristic produced by the plurality of frequency response determining elements is as close as possible to the desired frequency response characteristic entered at the graphic input device.

16 Claims, 11 Drawing Sheets

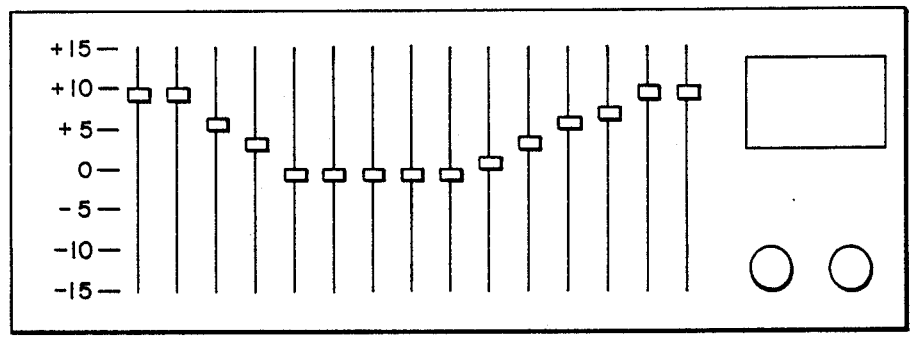
FIG. 1
FIG. 4
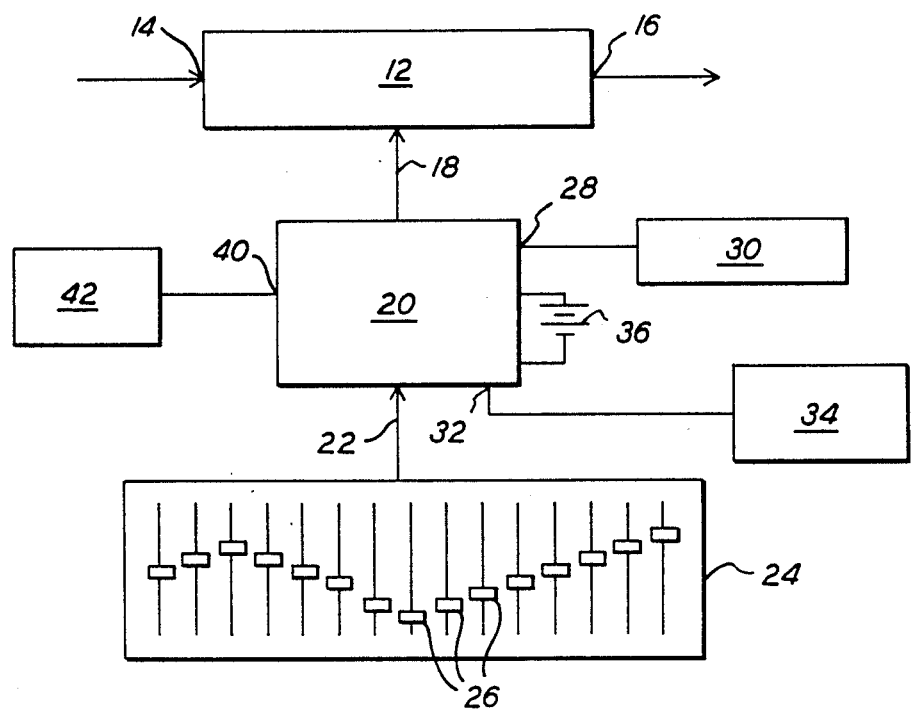

SELF-COMPENSATING EQUALIZER

This invention relates in general to frequency response determining apparatus and more particularly to a multi-band self-compensating audio frequency equalizer.

Audio frequency equalizers have been known for many years. In their most elementary form such equalizers include one or two (bass and treble) tone controls that directly provide an adjustable amount of boost or cut in one or two relatively wide audio frequency bands. The ever increasing sophistication of the music business and more stringent requirements for equalization have led to the development of multi-band equalizers having a plurality of frequency response determining stages, each providing a selectable amount of boost or cut in a relatively narrow band of frequencies and having little effect outside such band.

A particularly convenient and widely used form of multi-band equalizer is the graphic equalizer. Graphic equalizers typically have a frequency response determining circuit for each narrow audio frequency band that includes an adjustable component, often a slide resistor, oriented vertically in such a way that the positions of the controls or knobs of a plurality of adjacent adjustable components for each separate frequency band gives a graphical representation of the overall frequency response of the equalizer. For convenience, the controls on the input of an equalizer will be referred to as "knobs", the adjustable components of the frequency response determining elements will be referred to as "pots". This corresponds to the traditional construction of equalizers which used potentiometers (pots) that were actually controlled by knobs. In prior art equalizers the knob and pot settings were the same.

A simplified diagrammatic view of such a graphic equalizer is shown in FIG. 1. As illustrated, the equalizer is set to boost the base and treble frequencies and to provide essentially flat response in the mid-range. The controls themselves provide a convenient graphic representation of the desired frequency response characteristic of the equalizer. Equalizers of this type have become very popular. A recent variation on this type of equalizer utilizes a video or other similar display of the position of the controls which display can be manipulated by simple controls such as push buttons or a computer input device such as a mouse or the like. One known equalizer uses a rectangular array of light emitting diodes (LEDs) to simulate a row of slidable resistors. The position of each control is set with a pair of such buttons for moving the active LED up or down.

Unfortunately, prior art equalizers of the type referred to above and shown in FIG. 1 suffer from a serious defect. While the graphic display produced by the controls is extremely convenient, it does not accurately represent the actual frequency response of the equalizer and in many cases the difference is very significant. For example the settings shown in FIG. 1 actually produce the frequency response characteristic shown in FIG. 2. In FIG. 2, the settings of the controls have been superimposed over the actual frequency response characteristic for ease of comparison. In FIG. 2 and the other like figures, the actual frequency response of the equalizer is shown by the solid line, the positions of the input controls (knobs) are shown by small rectangular boxes and the actual settings of the frequency response determining elements (pots) are shown by X's. In prior art equalizers the pot and knob positions are equal. To produce the frequency response depicted graphically by the positions of the knobs in FIG. 1, the actual pot settings shown in FIG. 3 must be used. Another example of the errors that occur in prior art graphic equalizers is shown in FIG. 3A. The actual boost is almost twice what is indicated by the knobs.

The difference between the expected frequency response as represented graphically by the position of the knobs and actual frequency response characteristic produced by the pot settings and illustrated above is due to the out of band characteristics of the frequency response determining elements for each band. While each frequency response determining element has a primary effect within only one frequency band, it has a non-negligible secondary effect in at least one adjacent frequency band. Typically the out of band effects are non-negligible in the two or three adjacent bands when relatively large amounts of boost or cut are used. This makes accurate adjustment of prior art equalizers very difficult. The degree to which a frequency response determining element in one band affects the frequency response in an adjacent band is related to the Q of the element. The Q or quality factor of a filter is the ratio of the center frequency to the 3db bandwith of the filter. Frequency response determining elements with higher Q's have less effect in adjacent bands than do low Q elements but they may be undesirable for other reasons.

It is an object of this invention to provide an audio frequency equalizer that overcomes the disadvantages of equalizers constructed in accordance with the prior art.

Specifically, it is an object of this invention to provide a multiband audio frequency equalizer having graphic input means for selecting a desired frequency response characteristic, a plurality of frequency response determining elements and control means connected between the input means and the frequency response determining elements for automatically adjusting the frequency response determining elements to produce the frequency response characteristic represented by the graphic input means.

Briefly stated, in accordance with a presently preferred embodiment of this invention, a multi-band graphic equalizer is provided that includes a plurality of controllable frequency response determining elements, each element having a primary effect in its primary frequency band and a secondary effect in at least one adjacent frequency band, graphic input means for entering an input that graphically represents a desired frequency response characteristic, and means connected between the input means and the frequency response determining elements for calculating the necessary frequency response characteristic for each controllable frequency response element based on the in band and out of band effects of each element to produce the desired overall frequency response characteristic and for generating a plurality of sets of control signals, one set of control signals for each frequency response determining element, so that the overall frequency response characteristic produced by the plurality of frequency response determining elements is as close as possible to the desired frequency response characteristic entered at the graphic input means.

While the novel aspects of the invention are defined with particularity in the appended claims, the invention itself, together with further objects and advantages thereof, may be more readily understood by reference to the following detailed description thereof, taken in conjunction with the accompanying drawings in which:

FIG. 1 is a diagrammatic view of an equalizer in accordance with prior art;

FIG. 4 is a block diagram of an equalizer in accordance with this invention;

Figure 2:
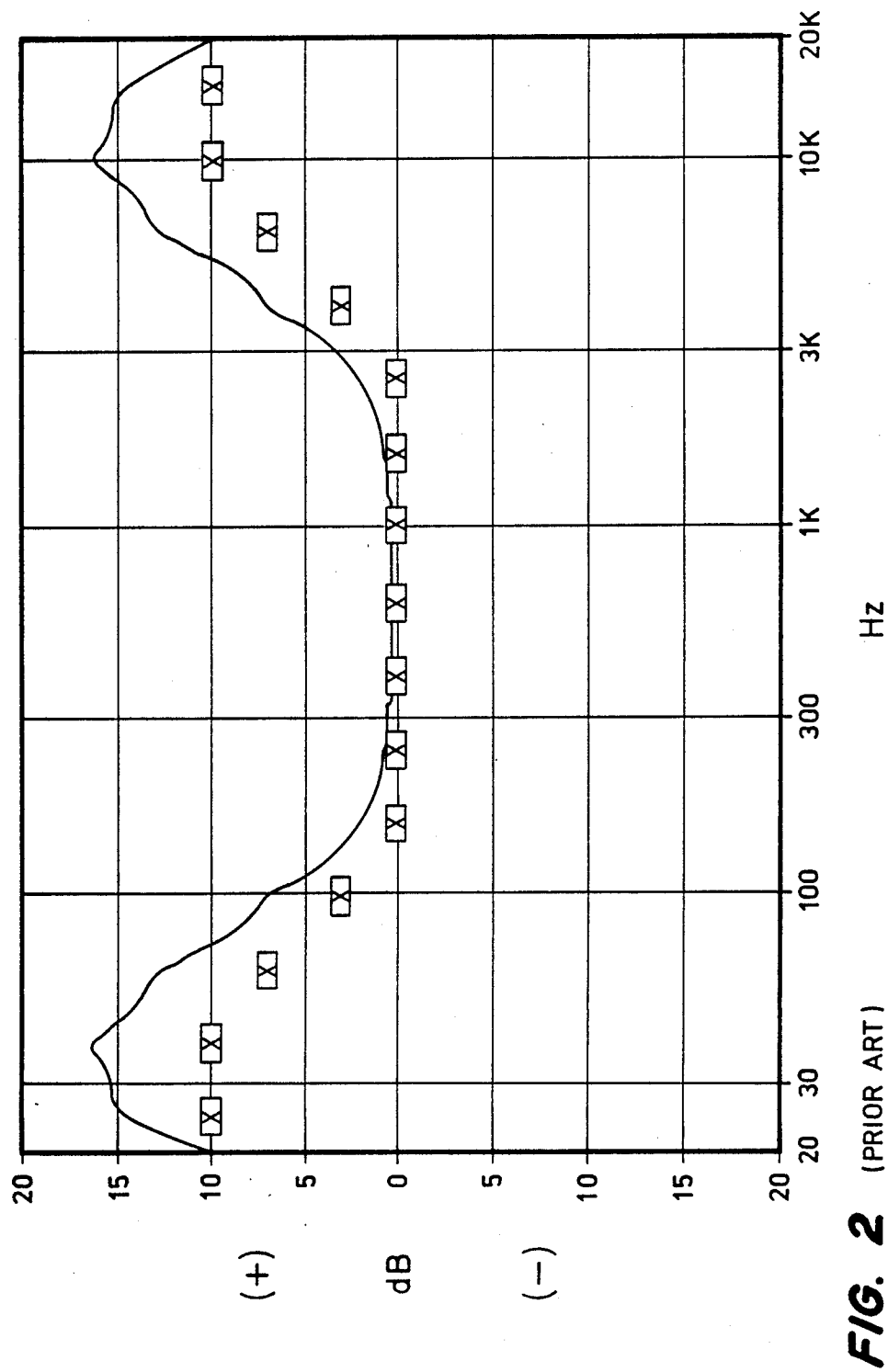
FIG. 2 is a graphical representation of the frequency response of a prior art equalizer superimposed over the control settings thereof.
Figure 3:
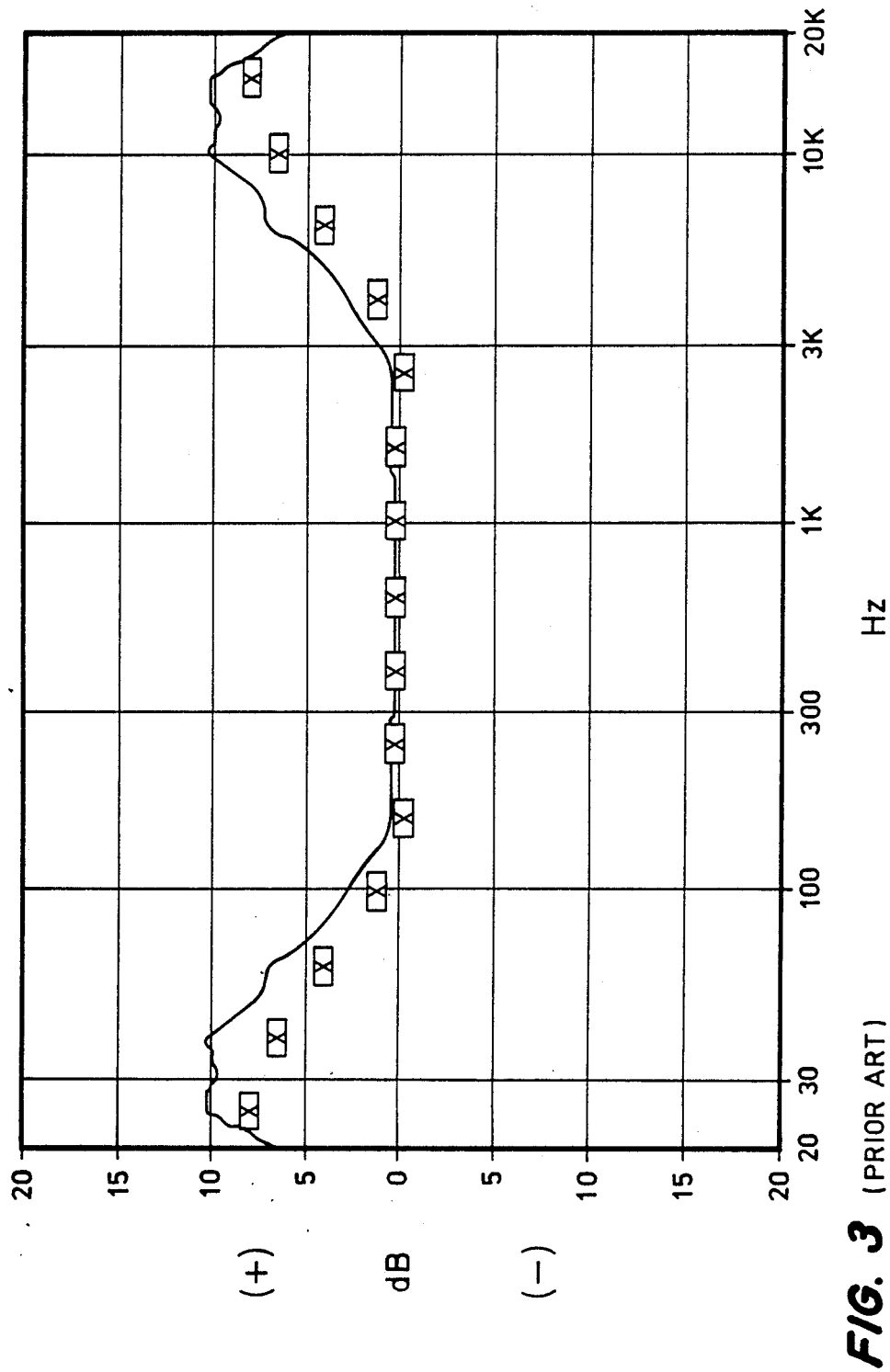
FIGS. 3 and 3A are further graphical representation of the frequency response characteristics of equalizers in accordance with the prior art.
Figure 3A:
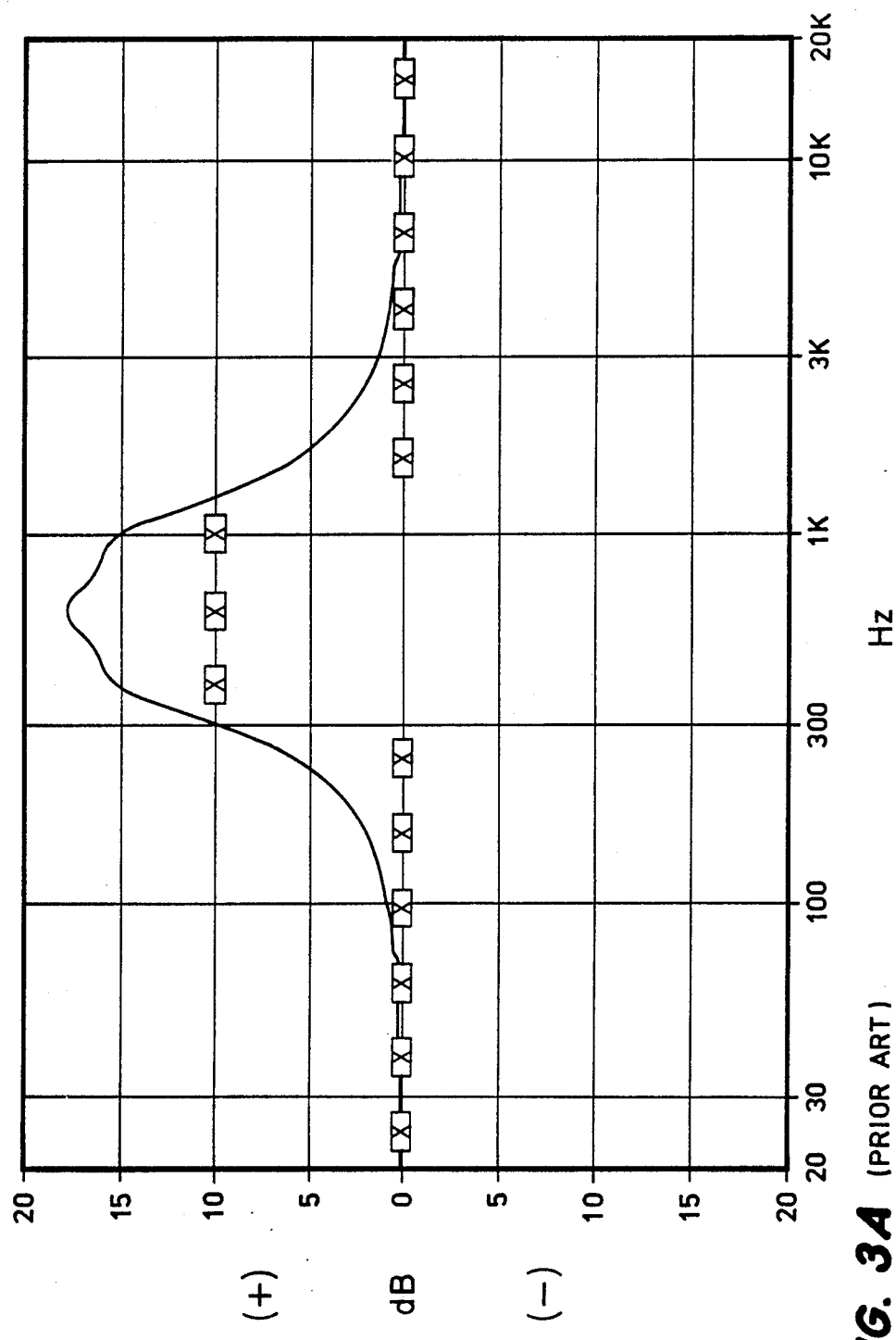

An equalizer in accordance with this invention is illustrated in block diagram form at FIG. 4. A frequency response determining module 12 is provided that has an audio frequency signal input port 14 and an audio frequency signal output port 16 adapted to be connected in series circuit relationship in an audio circuit to be equalized. Frequency response determining module 12 is connected by a plurality of control lines 18 to control module 20. Control module 20 is in turn connected by a plurality of control lines 22 to graphic frequency response input module 24. Input module 24 has a multiplicity of frequency response adjustment controls 26 arranged so that the position of the knobs on the controls provides a graphical representation of the frequency response characteristic entered at the input module.

Preferably, control module 20 also includes a output port 28 connected to a graphics display 30 for displaying the actual frequency response characteristics of the equalizer and, preferably the positions of controls 26 thereon. Display 30 is preferably a video display but may be a liquid crystal display, or an array of light emitting diodes or any equivalent display.

Control module 20 preferably also includes an output 32 for driving a display 31 that indicates the mode that the equalizer is in, and for prompting the user during adjustment. For example, when push button controls are used to select an audio channel to be adjusted and adjust the amount of boost/cut for such channel, display 34 preferably displays the channel number and the amount of boost/cut in db. This makes it possible to adjust the equalize locally without video display 30 if a video display is not available. Control module 20 is provided with a source of power, such as battery 36, which is preferably used in connection with an external source of power to provide operating power for the equalizer, together with uninterruptable back-up power therefor.

The equalizer is preferably also provided with an external interface 40 for sending and receiving control signals from a remote control unit 42 which preferably contains input controls and a display for showing the frequency response characteristic of the equalizer.

Figure 5:
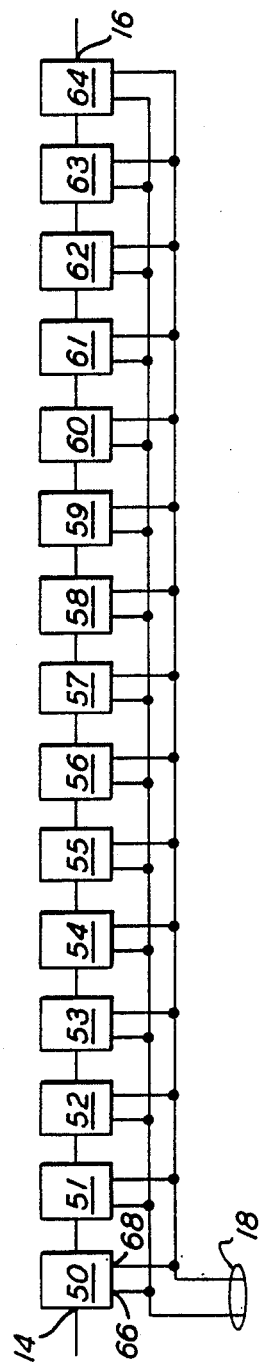
FIG. 5 is a block diagram showing an exemplary embodiment of a frequency response determining module in accordance with this invention.
Figure 6:
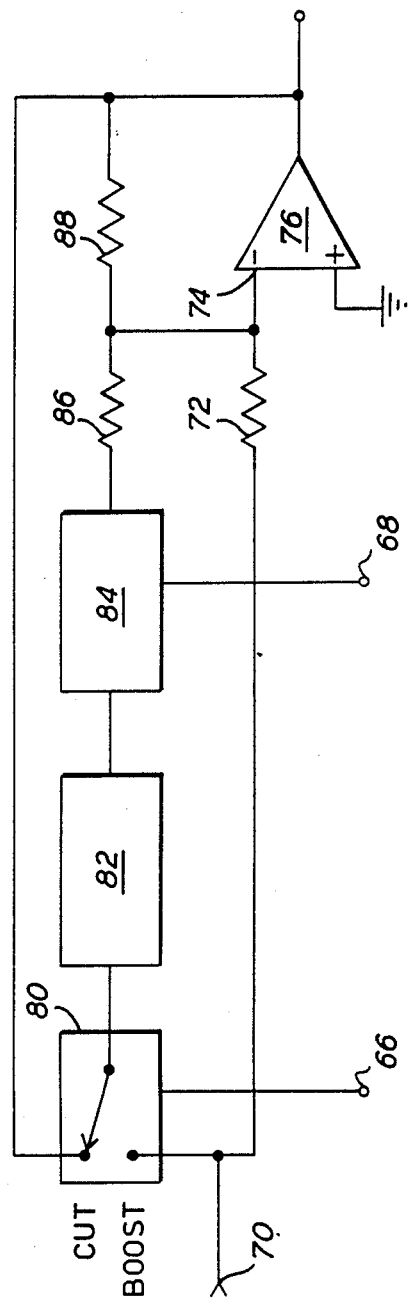
FIG. 6 is a simplified schematic diagram of one frequency response determining element of an equalizer in accordance with this invention.
Figure 7:
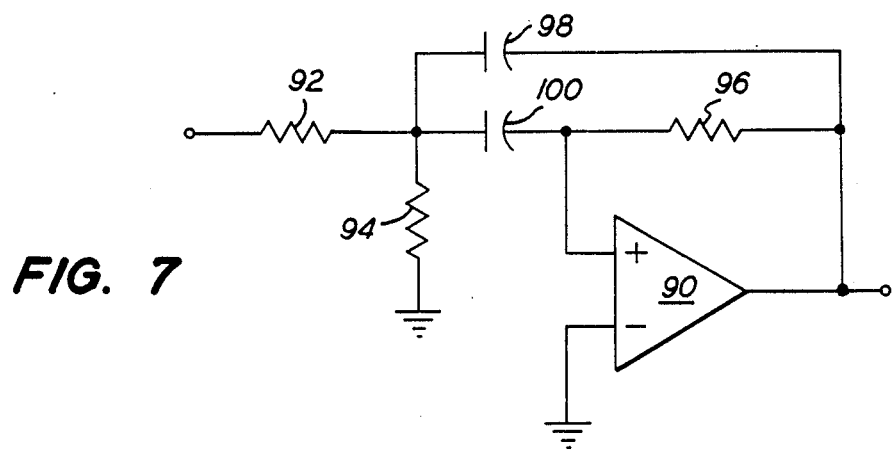
FIG. 7 is a schematic diagram of an exemplary embodiment of band pass filter 82 of FIG. 6.

An exemplary embodiment of a frequency response determining module 12 in accordance with this invention is shown in FIGS. 5 6, and 7. Referring now to FIG. 5, a plurality of controllable frequency response elements 50-64 is connected in series circuit relationship between input 14 and output 16. Each frequency response determining element has a boost/cut control input 66 and a level control input 68 which inputs, for convenience, are shown only in connection with element 50. While the boost/cut control lines and amplitude control lines 66-68 are shown in parallel to simplify the drawing, each frequency response element is independently controllable with regard to boost/cut and the amplitude thereof. This may be accomplished in a variety of ways including providing physically separate connections to each module, or by providing address lines and decoding means on a bus type structure, together with latch means for storing the control signal for each module. The latter system is preferred.

A block diagram schematic of an exemplary controllable frequency response element 50 is shown at FIG. 6. Module 50 includes an audio signal input 70 connected through resistor 72 to input 74 of operational amplifier 76. A remotely controllable switch 80 or relay is connected to boost/cut control line 66 and alternatively connects the series combination of band pass filter 82 and multiplying digital to analogue converter 84 and resistor 86 in parallel with resistor 72 to achieve a frequency response boost or in the feedback loop of amplifier 76 in parallel with resistor 88 to achieve a frequency response cut. Switch 80 is preferably an electrically controlled switch, most preferably a CMOS device such as a Signetics type 74HC4053N.

Figure 8:
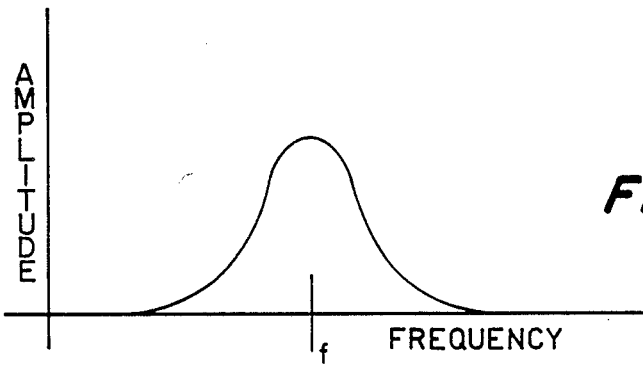
FIG. 8 is a graphical representation of the frequency response of the band pass filter of FIG. 7.

Any one of a number of well known band pass filter designs can be employed in connection with this invention. For example, the design shown in schematic form in FIG. 7 may he employed. Band pass filter 82 includes an operational amplifier 90 together with frequency response determining elements comprising resistors 92, 94 and 96 and capacitors 98 and 100 connected in feed back relationship with the operational amplifier 90 to produce the bandpass characteristic illustrated graphically at FIG. 8. Those skilled in the art will recognize that the band pass filter of FIG. 7 is one of a number of well known band pass filter configurations, any of which can be used in connection with this invention, so long as the characteristics thereof are well defined so that the frequency response can be calculated.

The frequency response characteristics of a band pass filter, such as the one shown in FIG. 7 can be defined in terms of several parameters, namely the center frequency, $f_0$; the bandwidth of the filter and the gain. Preferably the circuit of the bandpass filter and the components that make up a frequency response determining element are selected so that its boost and cut are symmetrical and the Q remains substantially constant over a range of boose/cut levels. Multiplying digital to analog converter 84 is used as a remote control attenuator, the attenuation of which is set by the control signals applied to terminal 68. Such attenuators are well known and a multiplying digital-analog converter well suited to be used in this invention is the MP 7628JN, Quad multiplying digital to analog converter manufactured by Micro Power Systems Inc. of Santa Clara, Calif. Because this converter is in series circuit relationship with filter 82, it is used in conjunction with an operational amplifier (not shown) to provide an invert signal output which together with the inversion produced by operational amplifier 90 produces a non-inverted signal at the output of converter 84 with respect to the input of filter 82.

Figure 9:
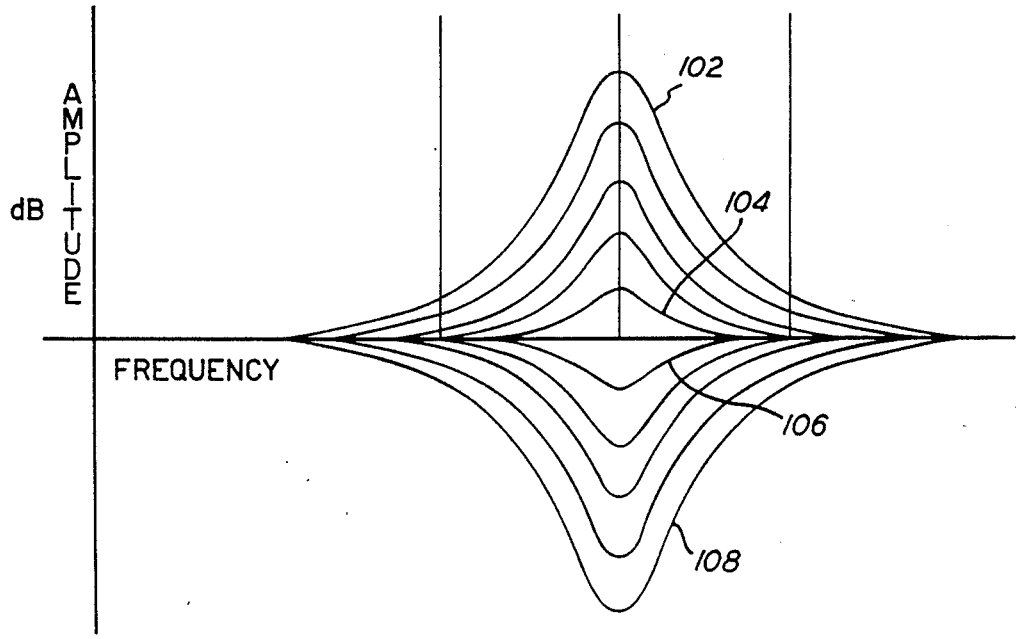
FIG. 9 is a graphical representation of the frequency response of the frequency response determining element of FIG. 6 at a number of boost and cut settings.
Figure 10:
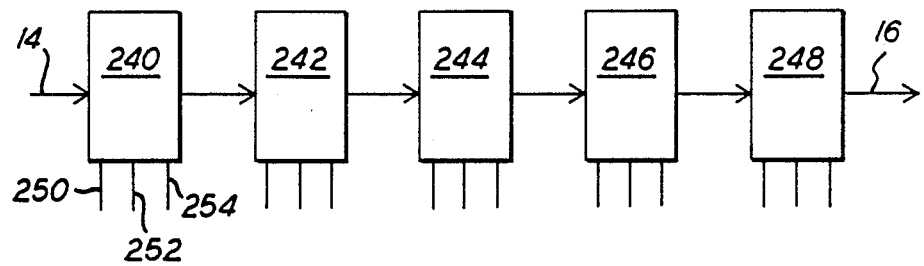
FIG. 10 is a block diagram of a parametric frequency response determining module in accordance with this invention.

FIG. 9 shows the response of a controllable frequency response element 50 for a variety of gain settings of amplifier 84. The gain of the frequency response element is plotted as a function of frequency for a plurality of settings of amplifier 84, ranging from maximum boost as shown by curve 102 through minimum boost as shown by curve 104 to minimum cut as shown by curve 106 and finally maximum cut as shown by curve 108. The intermediate curves represent intermediate degrees of boost and cut. The Q of controllable frequency response element 50 is substantially constant with varying degrees of boost and cut, but it willbe noted that at the small amounts of boost and cut, the curves do flatten out slightly. The importance of this will become clearer in conjunction with the discussion of the operation of control module 20.

While a presently preferred embodiment of this invention has a frequency response determining module 12 having a plurality of frequency response determining elements equal to the number of input controls, other arrangements are also within the scope of the invention. A particularly attractive embodiment of the invention as shown in Pig. 10 utilizes a small plurality (four to eight) of parametric frequency response determining elements 240, 242, 244, 246 and 248, each including control inputs 250, 252 and 254 for center frequency, Q, and amount of boost or cut respectively. Because a greater degree of flexibility is provided by such parametric elements, fewer elements are needed than for the constant Q fixed frequency elements shown in the embodiment of FIG. 5. While parametric equalizers are known and are useful in their present form, that is directly controlled by the user, a high degree of skill is needed to adjust them properly to achieve a desired result. This invention provides a particularly advantageous graphic user interface for a parametric equalizer that greatly enhances its utility. The user can directly enter the desired frequency response at the input module 24 and control module 20 provides the necessary signals to the parametric frequency response determining elements to achieve the desired response. It will be appreciated that the control signals, applied to each parametric frequency response determining element will be a function of a plurality of input controls 26.

In accordance with a presently preferred embodiment of this invention, control module 20 comprises a stored program micro-computer responsive to signals received from control input module 24 to produce a plurality of signals applied to frequency response determining module 12 to produce the desired frequency response characteristics of the equalizer. Thus, there is no direct connection between the input module 24 and the frequency response determining module 12 as was the case in prior art equalizers.

Figure 11:
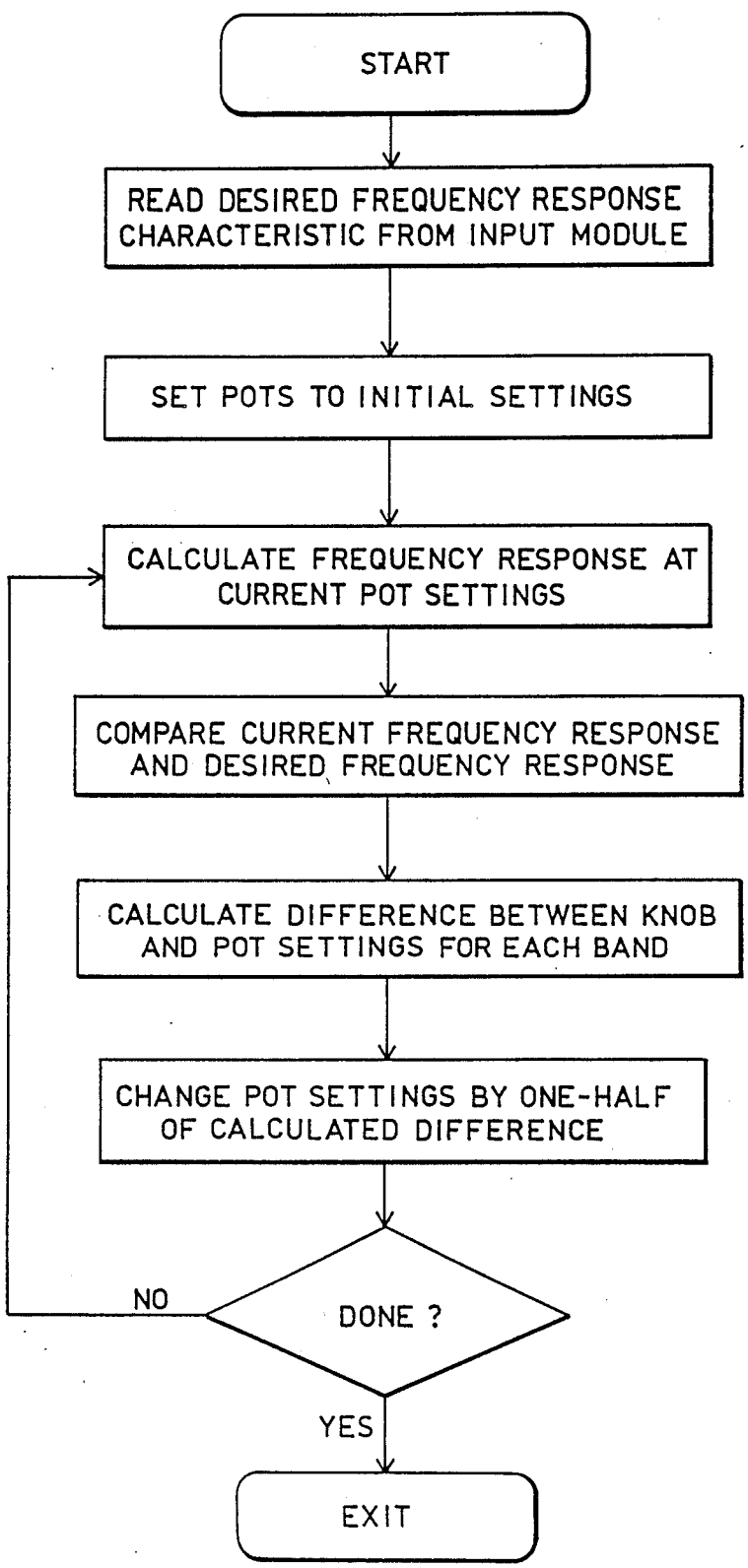
FIG. 11 is a block diagram of a method for adjusting the frequency response elements of an equalizer in accordance with this invention to produce a desired frequency response characteristic.

In accordance with a presently preferred embodiment of this invention, an iterative method for determining the setting for each controllable response element is utilized as shown in flow chart form in FIG. 11.

Referring now to FIG. 11, a preferred method for adjusting the controllable frequency response elements of an equalizer in accordance with this invention is illustrated. In conjunction with the description of the method of this invention, and the term "knobs" denotes the setting of the controls on the frequency response input module and the term "pots" denotes the settings of the controllable amplifiers B4. These terms correspond to the historical equalizer configuration wherein actual variable resistors or potentiometers (pots) controlled the frequency response of the individual elements, while the position of the controls (knobs) on such resistors graphically represented the response of the equalizer.

The method for adjusting the individual frequency determining elements of an equalizer in accordance with this invention begins with the step of reading the desired frequency response from the input module. The input module provides a plurality of signals each of which sets the amount of boost/cut in one frequency band. Together these signals describe the overall desired frequency response. The control module then generates control signals to set the pots (the controlled gain amplifiers 84) to their initial settings. While the method of this invention will work when the initial pot settings are zero, that is no boost and no cut, it is preferred to initialize the pots to the positions of the knobs as an initial setting. The method converges to the desired settings more quickly when this is done.

The next step is calculating the frequency response in each band produced by the current setting of the pots. This is done by summing the frequency responses of the individual frequency response elements that have an effect in each band to produce a total frequency response. Each frequency response element has a primary effect at its center frequency and secondary effects which diminish in magnitude at frequencies removed from the center frequency. The response of a band pass filter may be represented by its transfer function H(s) as follows:

$$H(s) = \frac{G\,S\,(w/Q)}{s^2 + s\,(w/Q) + w^2}$$

and the transfer function for each frequency response determining element is

1+A H(s)

for boost, and $$\frac{1}{1 + A\,H(s)}$$

for cut, where s is the complex frequency, Q is the quality factor of the filter, defined as the center frequency divided by the filter 3 db band width, w is the center frequency in radians G is the gain of the filter at its center frequency and A is the attenuation of D-A converter 81. Next, the total amount of boost or cut for each band is calculated.

Next the difference between the desired response (knob setting) and the actual amount of boost/cut is calculated for each band. If the difference is less than the minimum increment of boost/cut that can be added (typically one half db) no changes are made and the process is complete. If not then half of this difference is added to each pot setting.

If no pot settings have changed by at least a preselected amount, then the process is complete. If there has been at least one change the calculation step and subsequent steps are repeated until either no changes occur or a preselected maximum number of iterations have been completed. In accordance with a preferred embodiment of this invention, control module 20 includes memory means for storing the pot position values for a plurality of frequency response characteristics which can be recalled when needed, thereby avoiding the necessity for recalculation.

It will be understood that the actual transfer function of the band pass filter used in an equalizer constructed in accordance with this invention is not critical, so long as it is known. It is a feature of this invention that the characteristics of the band pass filters, particularly the out of band characteristics are compensated for by the equalizer itself. Accordingly, while good quality filters are desirable, a broader range of filters can be used with good results than has been possible heretofore in prior art equalizers.

Those skilled in the art will recognize that there are frequency response characteristics that may be impossible to achieve with a finite number of frequency response determining elements. Specifically, though not particularly useful, the of frequency response denoted by sliding the knobs alternately to their maximum boost and cut positions cannot be actually achieved. In such cases, the control module will approximate the input frequency response characteristic as closely as possible and will terminate after no changes are made in two consecutive loops, or the maximum number of iterations is reached.

Figure 13:
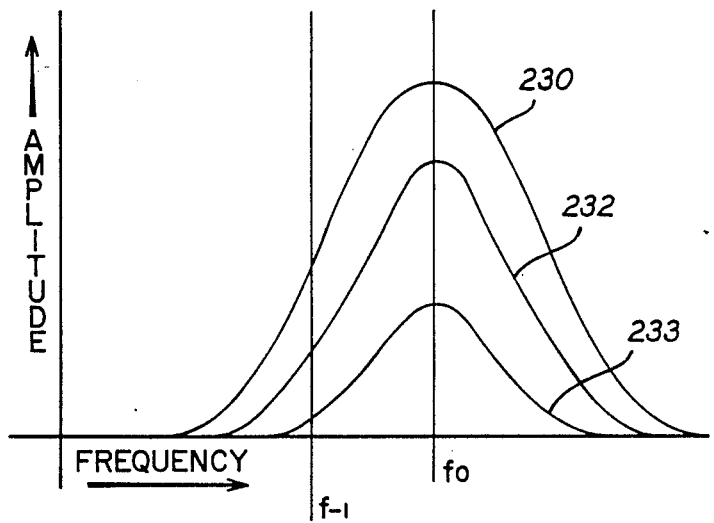
FIG. 13 is a graph showing the out of band effects of the frequency response determining element of FIG. 6.
Figure 12:
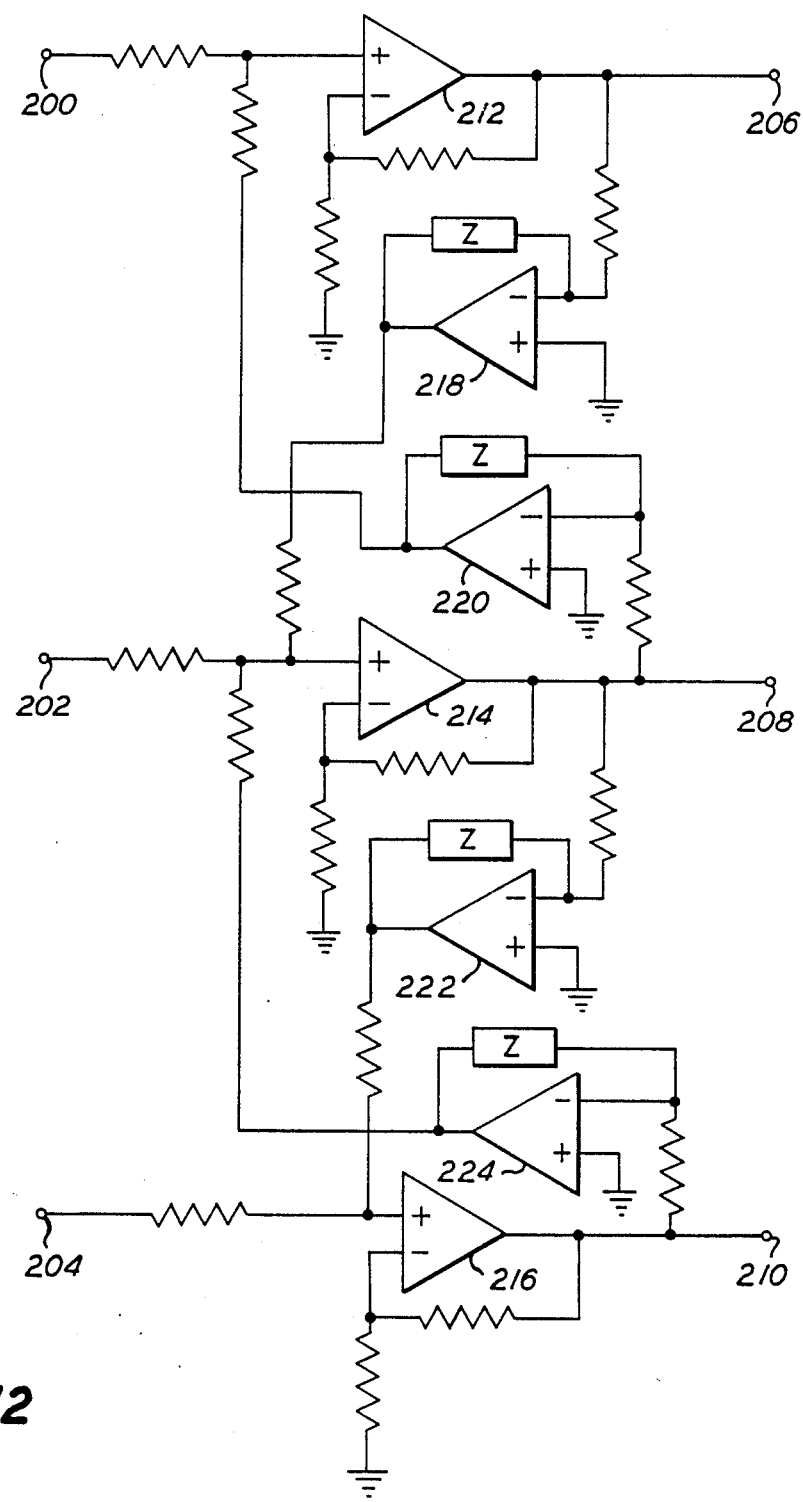
FIG. 12 is a simplified schematic diagram of a control module in accordance with an alternative embodiment of this invention.
Figure 15:
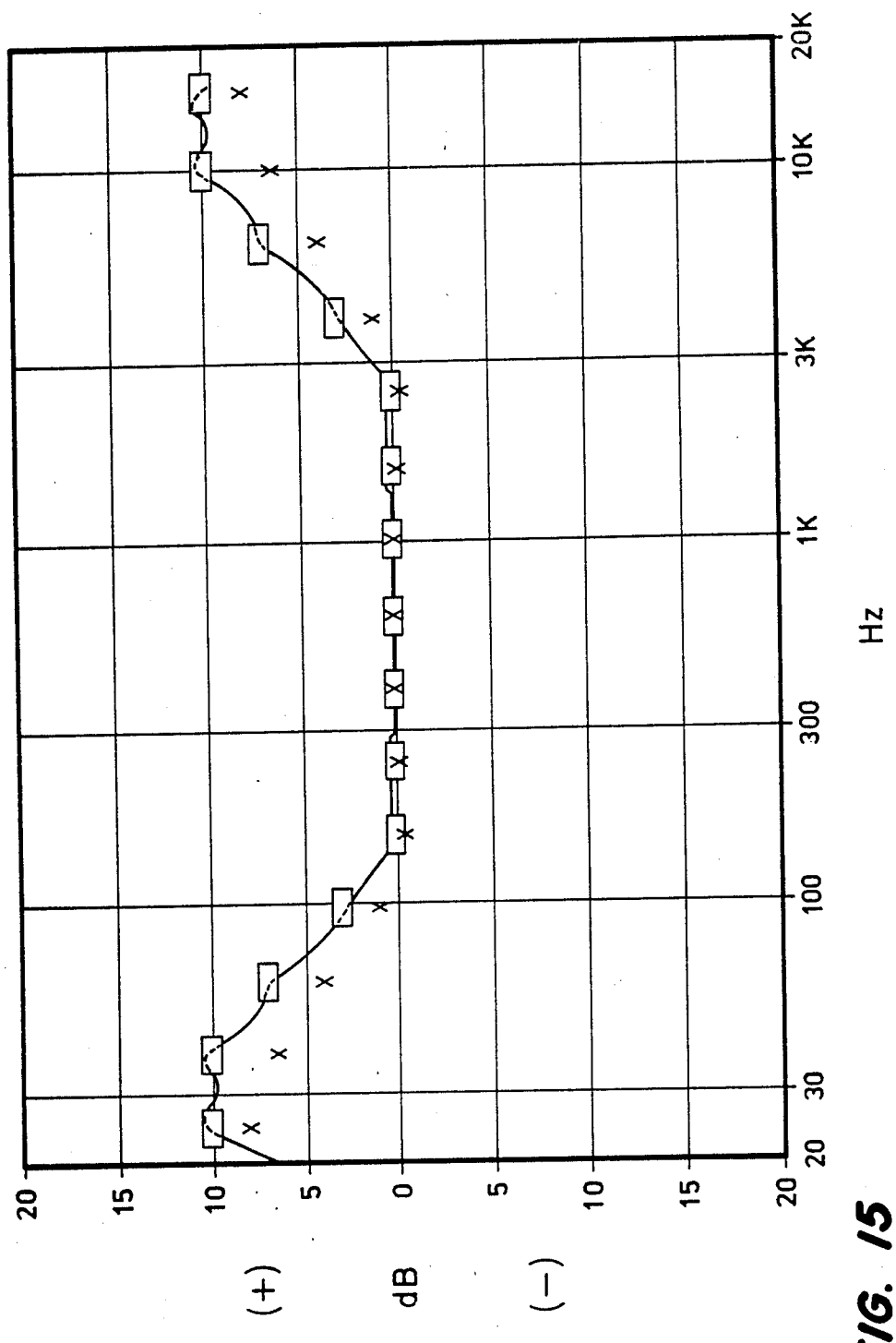
FIG. 15 is a graphical representation showing an exemplary position of the input controls of an equalizer in accordance with this invention, the effective position of each frequency response determining element, and the overall frequency response of the equalizer.

While a preferred embodiment of this invention utilizes a stored program digital computer to calculate the pot settings required to produce the desired frequency response characteristic, those skilled in the art will recognize that other methods for achieving the same results may also be used. For example, the invention may be thought of as providing a primary boost/cut amplitude signal and one or more compensating signals to each controllable frequency response element. The compensating signals are summed with the primary signal to adjust each element to compensate for the boost or cut introduced by one or more adjacent controllable frequency response determining elements, so that the overall frequency response will be as close as possible to the desired frequency response as set in the graphic input module. A simplified block diagram schematic of an equalizer in accordance with an alternative embodiment of this invention is illustrated at FIG. 12. Only a portion of a control module showing three knob inputs, 200, 202 and 204 and three pot outputs 206, 208 and 210 are shown. Each channel includes a summing amplifier 212, 214 and 216 respectively, one or more compensating amplifiers, and feedback and summing resistors. For example, referring to knob input 202, amplifier 214 sums the actual input and the outputs from compensating amplifiers 218 and 224, which provide compensating signals from the first and third channels 200 and 204 respectively. Each compensating amplifier has a feedback impedance module Z that provides a compensating signal that cancels the out of band effect of each frequency response element in the adjacent frequency band. The magnitude of the compensating signal may be appreciated by referring now &o FIG. 13 which shows the frequency response of a frequency response determining element at 5, 10 and 15 db of boost respectively. Referring first to the 15 db curve 230, the amount of unwanted boost in adjacent frequency band $f_{-1}$ is 7.5 db and compensating signal would be $-7.5$ db. Where 10 db boost is applied, curve 232, the amount of unwanted boost in the adjacent frequency band is only 4 db and the compensating signal would accordingly be only $-4$ db and where only 5 db of boost is employed curve 233 there is only 1 db in the adjacent frequency band and accordingly $-1$ db of compensation is applied. It will be appreciated, therefore, that the compensating amplifiers 218, 220, 222 and 224 together with their feedback impendence elements are non-linear in order to provide the correct amplitude compensating signals over the entire range of boost and cut provided in the equalizer.

Figure 14:
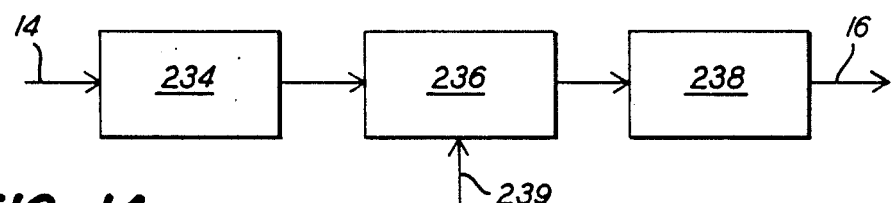
FIG. 14 is a block diagram of a digital frequency response determining element in accordance with this invention.

While this invention has been described in connection with an embodiment utilizing an analog frequency response determining module, other embodiments such as digital signal processors may also be employed, as shown in FIG. 14. As digital signal processors become available that have the speed necessary to perform the equalization function, they offer a number of advantages such as low noise and flexibility over analog frequency response determining elements. The essence of this invention is the same whether digital or analog signal processors are utilized, namely that control means are provided between the graphic input and the frequency response determining module that provides signals to the module that are responsive to two or more input controls to produce a frequency characteristic that is as close as possible to the characteristic set at the input. As shown in FIG. 14, an audio signal is converted to digital form by high speed analog to digital converter 234. The digital signal is connected to digital signal processor 236 which is preferably a model DSP 56001 manufactured by Motorola, Inc. and the digital output is converted to an analog audio signal by digital to analog converter 238. Control signals from module 20 are connected to digital signal processor 236 by control wires 239.

In addition to enabling the use of advanced technologies such as digital signal processors, this invention permits the use of analog frequency response determining circuits that are very difficult to utilize in conventional equalizers. Specifically, some frequency response determining elements are unsatisfactory in prior art equalizers because the elements themselves interact. That is making an adjustment to one element affects the frequency response of adjacent elements. These effects are in addition to any secondary effects in adjacent bands caused by the band width of the elements. In accordance with this invention, because the control module calculates the actual frequency response of the frequency response determining module, interactions between elements, so long as they are well defined, are permissible.

FIG. 14 shows the knob settings, the pot settings and the actual frequency response characteristic produced by an equalizer in accordance with this invention that is set up in the same way as the prior art equalizer shown in FIG. 2. The pot settings as set by control module 20 produce a frequency response that almost perfectly duplicates the knob positions. While the invention has been described in connection with a presently preferred embodiment thereof, those skilled in the art will appreciate that many modifications and changes therein may be made without departing from the true spirit and scope of the invention, which accordingly is intended to be defined solely by the appended claims.

What is claimed:

1. An equalizer comprising:
a signal input;
a signal output;
graphic input means for setting a desired frequency response characteristic;
a plurality of controllable parametric frequency response determining elements connected between the signal input and the signal output;
control means connected to said graphic input means and said frequency response determining elements for supplying control signals to said frequency response elements to produce said desired response characteristic.

2. The equalizer of claim 1 wherein said graphic input means comprises a plurality of individually settable controls adapated to be set to a desired amount of boost or cut in a plurality of frequency bands to graphically represent said desired frequency response characteristic.

3. The equalizer of claim 2 wherein said individually settable controls comprise slidable controls.

4. The equalizer of claim 1 wherein said plurality of controllable frequency response elements comprises a plurality of variable gain filters each having a primary effect in a first frequency band and a secondary effect in a second frequency band adjacent to said first frequency band.

5. The equalizer of claim 4 wherein said control means adjusts said frequency response elements to compensate for said secondary effect.

6. The equalizer of claim 1 wherein said graphic input means comprises a video terminal.

7. The equalizer of claim 1 wherein said control means comprises means for summing the effects of the plurality of frequency response elements and adjusting said elements until the sum equals the desired frequency response characteristic.

8. A method for adjusting a multiband equalizer of the type that includes means for providing a plurality of desired response settings, and a plurality of controllable frequency response stages having known characteristics comprising the steps of:
storing data representing said known characteristics of said frequency response stages;
generating a plurality of control signals from said desired response settings;
generating a plurality of compensating signals from said desired response settings and said stored data;
summing said control signals and compensating signals to form a plurality of compensated control signals; and
coupling said compensated control signals to said controllable frequency response stages.

9. An equalizer comprising:
a signal input;
a signal output;
graphic input means for setting a desired frequency response characteristic;
a plurality of variable gain fixed frequency filters each having a primary effect in a first frequency band and a secondary effect in a second frequency band adjacent to said first frequency band connected between the signal input and the signal output;
a plurality of summing amplifiers responsive to said graphic input means for generating a plurality of control outputs;
compensating means connected to the control output of each of said summing amplifiers for generating a compensating signal equal in magnitude and opposite in polarity to said secondary effect; and
means connecting said compensating signals to the input of the summing amplifier for said second frequency band.

10. In a multiband graphic equalizer including a plurality of parametric filters, each having a primary effect in a primary frequency band and a secondary effect in an adjacent frequency band the improvement comprising:
means for entering an input representing a desired frequency response characteristic for each frequency band of said equalizer;
means for calculating the necessary frequency response characteristics for each of said parametric filters so that the sum of said primary and secondary effects equals the desired frequency response characteristic for each band, and for generating a plurality of output signals, one for each filter so that the overall effect produced by said plurality of parametric filters is as close as possible to said desired frequency response characteristic.

11. The equalizer of claim 10 wherein said means for entering an input comprises graphic means having a plurality of knobs the totality of which graphically represent said desired frequency response characteristic.

12. The equalizer of claim 10 wherein said means for entering an input comprises video display means.

13. A method for adjusting a multiband equalizer having a plurality of frequency response determining elements of the type having a primary effect in a first frequency band and a secondary effect in a secondary frequency band to obtain a desired frequency response characteristic in a plurality of bands comprising:
storing data representing the characteristics of said frequency response elements;
initializing each of said elements to a preselected setting;
determining said secondary effects from said stored data;
summing the primary and secondary effects for each of said plurality of bands;
comparing the sum to the desired response;
setting each element to a new setting between the sum and the desired response; and
repeating said comparing and setting steps.

14. A multiband equalizer comprising:

input means for setting a plurality of separate desired frequency response characteristics in each of a plurality of bands;

a plurality of controllable frequency response determining elements each having a known primary response characteristic in one of said bands and a known secondary response characteristic in another of said bands;

means for storing data representing the characteristics of said frequency response determining elements;

means for determining said secondary response characteristic from said stored data;

compensating means connected to said input means and having a plurality of outputs connected to said elements for generating from said desired frequency response characteristics and said known primary and secondary response characteristics a control signal for each frequency response determining element to set the response characteristic of said element so that the sums of the primary and secondary responses in each band equals the desired frequency response characteristics in such band.

15. An equalizer comprising:

input means for setting a desired frequency response characteristic in a first band and second band;

first and second frequency response determining filters each having a primary effect in said first and said second band respectively, a secondary effect in said second and said first frequency band, respectively, and having a control input;

means for storing data representing the characteristics of said first and second filters;

combining means responsive to said input means for each band for generating a control output, coupled to the control input of at least one of said filters;

compensating means response to said input means and said stored data for generating a compensating signal for correcting for said secondary effect;

means for coupling said compensating signal to said combining means so that the control signal for each band is a function of the input means for both said bands.

16. An equalizer comprising:

input means for setting a first desired frequency response characteristic in a first band and a second desired frequency response in a second band;

a first frequency response element, having a primary effect in said first band and a secondary effect in said second band;

a second response element having a primary effect in said second band and a secondary effect in said first band;

means for storing data representing the characteristics of said first and second frequency response elements;

control means connected to said input means and responsive to said first desired frequency response and said stored data, for generating a control signal for said first frequency response element and a compensating signal for said second frequency response element, and responsive to said second desired frequency response and said stored data for generating a control signal for said second frequency response element and a compensating signal for said first frequency response element; and means for coupling said control signals and compensating signals to said frequency response elements.

* * * * *